United States Patent [19]

Geerlings

[11] Patent Number: 4,677,381
[45] Date of Patent: Jun. 30, 1987

[54] FLUX-GATE SENSOR ELECTRICAL DRIVE METHOD AND CIRCUIT

[75] Inventor: Steven L. Geerlings, Zeeland, Mich.

[73] Assignee: Prince Corporation, Holland, Mich.

[21] Appl. No.: 662,717

[22] Filed: Oct. 19, 1984

[51] Int. Cl.$^4$ .......................................... G01R 33/04
[52] U.S. Cl. ...................................... 324/253; 33/361; 318/647; 324/254
[58] Field of Search .................. 33/361; 324/253, 254, 324/255; 318/647, 654, 661; 361/152

[56] References Cited

U.S. PATENT DOCUMENTS

| | | |
|---|---|---|
| 2,475,593 | 7/1949 | Craddock et al. . |
| 2,852,859 | 9/1958 | Depp . |
| 3,626,280 | 12/1971 | Englihoven et al. ............... 324/253 |
| 3,678,593 | 7/1972 | Baker et al. . |
| 3,744,312 | 7/1973 | Anderson . |
| 3,903,610 | 9/1975 | Heaviside et al. . |
| 3,943,763 | 3/1976 | Garner . |
| 3,991,361 | 11/1976 | Mattern et al. . |
| 4,024,382 | 5/1977 | Fowler . |
| 4,030,204 | 6/1977 | Edwards . |
| 4,112,755 | 9/1978 | Sullivan . |
| 4,157,619 | 6/1979 | Zuvela . |
| 4,179,741 | 12/1979 | Rossani . |
| 4,277,751 | 7/1981 | Lawson et al. . |
| 4,293,815 | 10/1981 | West et al. ......................... 324/254 |
| 4,336,596 | 6/1982 | Martin . |
| 4,373,271 | 2/1983 | Nitz . |
| 4,413,424 | 11/1983 | Sasaki et al. . |
| 4,414,753 | 11/1983 | Moulin et al. . |
| 4,416,067 | 11/1983 | Scherer et al. . |
| 4,424,631 | 1/1984 | Franks .................................... 33/361 |
| 4,429,469 | 2/1984 | Tsushima et al. . |
| 4,445,279 | 5/1984 | Tsushima et al. . |
| 4,546,551 | 10/1985 | Franks .................................... 33/361 |

FOREIGN PATENT DOCUMENTS 57-116211  7/1982  Japan .

OTHER PUBLICATIONS

"A Magnetic Heading Reference for the Electro/Fluidic Autopilot" Part 1 and Part 2; by Doug Garner; from the Nov. and Dec. 1981 Issues of *Sport Aviation.*
Magnetic Field Sensor and its Application to Automobiles, by Hisatsugu Itoh, 1980 SAE paper, SAE/-SP-80/458.

*Primary Examiner*—Reinhard J. Eisenzopf
*Assistant Examiner*—Robert W. Mueller
*Attorney, Agent, or Firm*—Price, Heneveld, Cooper, DeWitt & Litton

[57] ABSTRACT

An electrical drive dircuit for a flux-gate magnetic sensor used in a digital compass for a vehicle provides signals for application to the primary of a flux-gate sensor to assure the core is saturated at a predetermined time during each cycle of the drive signal.

25 Claims, 4 Drawing Figures

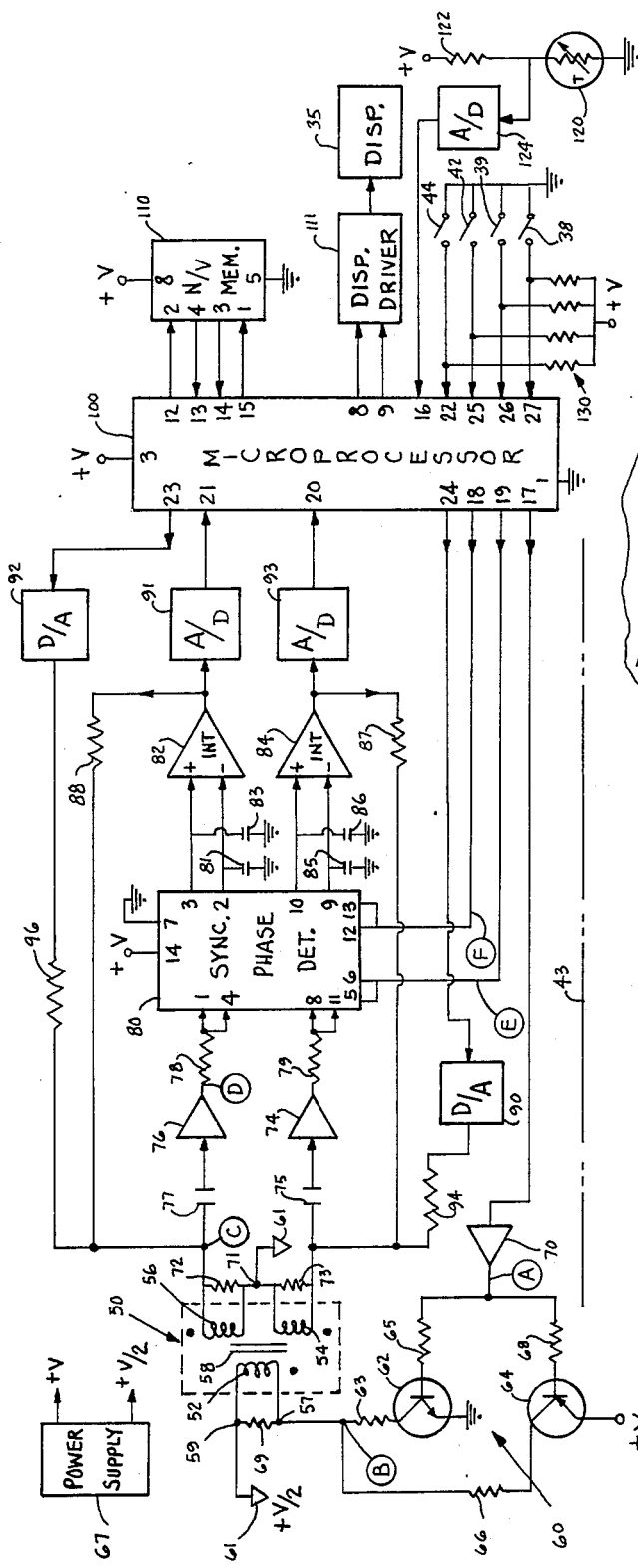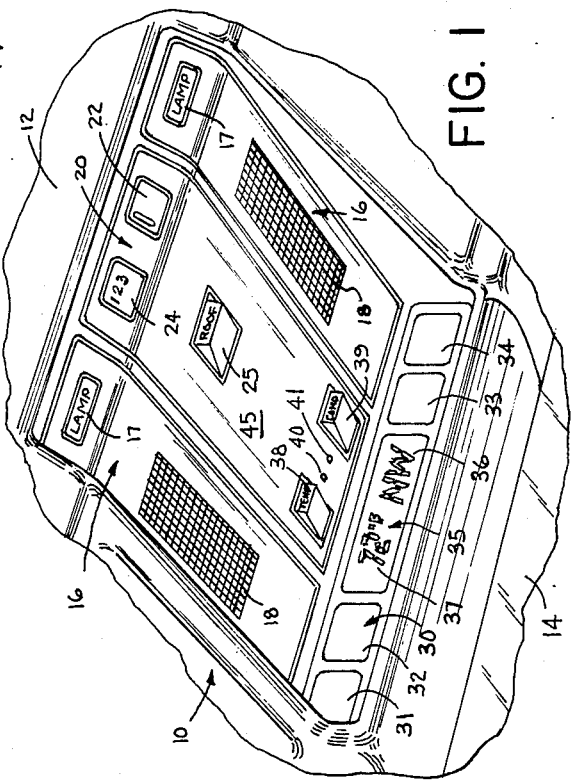
FIG. 1
FIG. 2

FLUX-GATE SENSOR ELECTRICAL DRIVE METHOD AND CIRCUIT

BACKGROUND OF THE INVENTION

The present invention relates to an electrical circuit and method for providing drive signals for a flux-gate magnetic sensor used in connection with an automotive or vehicle compass.

Typically, vehicle mounted compasses have been mechanical types with rotating compass cards mounted in a viscous damping media. An electrical compass has been described in a 1980 SAE paper entitled *Magnetic Field Sensor and Its Application to Automobiles* by Hisatsugu Itoh, SAE/SP-80/458. This compass employs a flux-gate sensor and solid state circuits. U.S. Pat. No. 4,546,551 entitled ELECTRICAL CONTROL SYSTEM and assigned to the present assignee discloses an automotive compass in which a flux-gate sensor is employed and which employs digital bandpass filtration to process signals from the sensor. The filter and compass system is also disclosed in U.S. Pat. No. 4,424,631, assigned to the present assignee.

A flux-gate sensor, as is well known, is driven by a fundamental frequency, and information is obtained from the amplitude and polarity changes of the second harmonic frequency signals obtained from the sensor. In order to precisely detect the second harmonic signals, it is necessary to employ synchronous phase detectors to assure the information from the two channels is synchronized to provide the desired vectored output information corresponding to vehicle heading. In the past, either analog or digital filtering has been required to provide a sinusoidal second harmonic signal which can be processed to supply the necessary information. The digital filtration system has proven successful in providing the desired information, however, only with the addition of significant circuit expense for the digital filter itself as well as associated circuit elements.

SUMMARY OF THE PRESENT INVENTION

It has been discovered that by electrically driving the primary coil of the flux-gate sensor such that its core reaches saturation at a predetermined time during each of the periodic drive signals, the resultant second harmonic output signal is aligned with respect to the reference drive signals and can be used to provide vehicle direction information without the need for expensive digital or analog filtration.

The system of the present invention, therefore, provides an electrical drive circuit for a flux-gate magnetic sensor used in a digital compass for a vehicle and a method of driving a flux-gate sensor for such application. The electrical drive circuit provides signals for application to the primary of a flux-gate sensor to assure the core is saturated at a predetermined time during each cycle of the drive signal. Second harmonic signals from the secondary windings are then amplified and applied to a synchronous phase detector, actuated by phase related second harmonic frequency signals and subsequently integrated and applied to a microprocessor for providing signals representative of the vehicle direction and for actuating a display for displaying such information to the vehicle operator.

Thus, the present invention embodies a method of assuring that signal information from a flux-gate sensor is in predetermined phase relationship with respect to the drive frequency, and one which can be readily processed by subsequent electrical circuitry to provide the necessary vehicle direction information.

These and other features, advantages and objects of the present invention will become apparent upon reading the following description thereof together with reference to the accompanying drawings in which:

BRIEF DESCRIPTION OF THE DRAWINGS

FIG. 1 is a fragmentary, perspective view of a display and control module embodying the present invention;

FIG. 2 is an electrical circuit diagram partially in block and schematic form, of the system embodying the present invention;

-FIGS. 3A–3F, are waveform diagrams of the electrical voltage waveforms at various locations of the circuit shown in FIG. 2.

DETAILED DESCRIPTION OF THE PREFERRED EMBODIMENT

Figure 3:
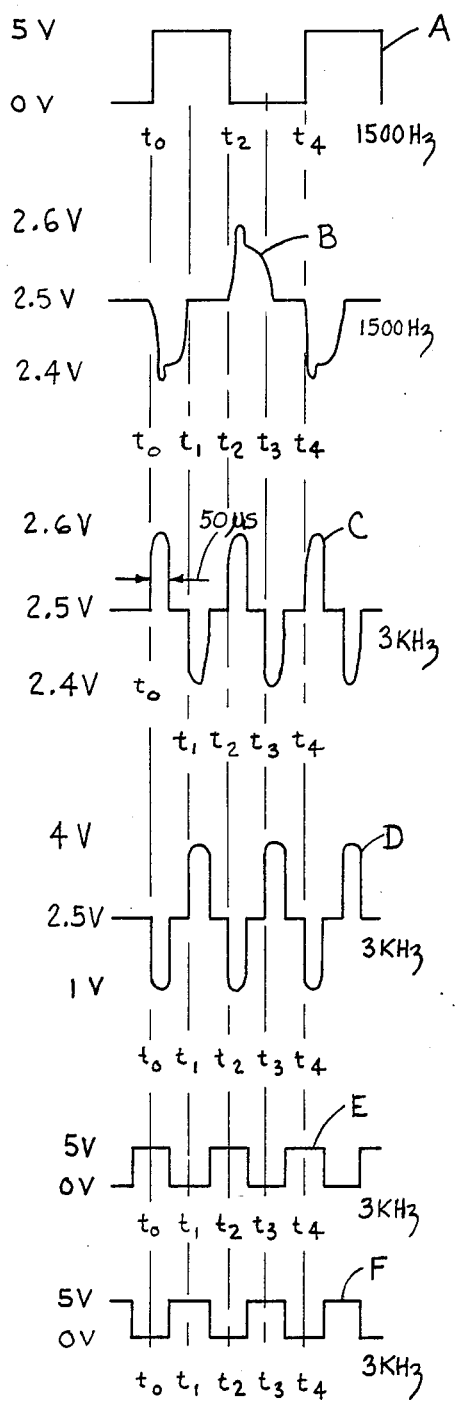
FIG. 3, including sub

Referring initially to FIG. 1, there is shown a control and display module 10 which is adapted to be integrally included in a vehicle during manufacturing, although it could be separately added at a later time. The module 10 is mounted to the roof 12 of a vehicle and centered near the top edge of windshield 14, typically above the rearview mirror. Module 10 includes a pair of map reading lamps 16 having switches 17 for operating lamp means positioned behind lenses 18 which direct illumination into the lap area of either the driver or passenger side of the vehicle, depending on which switch is actuated. The center of the module includes a garage door opening transmitter 20 including a three-position switch 22 for actuating any one of three different garage door remote control units by the actuation of push-button switch 24. Module 10 may also include an electrical sunroof control switch 25. The construction of the lamp modules 16 and garage door transmitter module 20 is generally disclosed in U.S. Pat. No. 4,241,870, issued Dec. 20, 1980 and assigned to the present assignee.

Module 10 additionally includes a separate display panel 30 which includes display indicators 31, 32, 3 and 34 for displaying vehicle operating parameters such as engine temperature, oil pressure, generator and fuel warnings or the like which can either be displayed in a digital alpha-numeric format or as warning lights. The center of display module 30 includes a digital display 35 providing, in one embodiment of the present invention, an octant display 36 of the vehicle heading in an alpha format, and on the left side of display 35, a temperature display 37 providing fahrenheit or centigrade display of the exterior ambient temperature of the air near the vehicle as well as a warning signal when road conditions approach freezing. The temperature display circuit is actuated by a push-button temperature switch 38 while the compass circuit is actuated by a push-button switch 39. A pair of apertures 40 and 41 provide limited access to calibrate and variation switches 42 and 44, respectively (FIG. 2), which are only occasionally used are push switches mounted to a circuit board 43 (FIG. 2) positioned behind panel 45 and are actuated by a pointed instrument such as a ball point pen.

Figure 4:
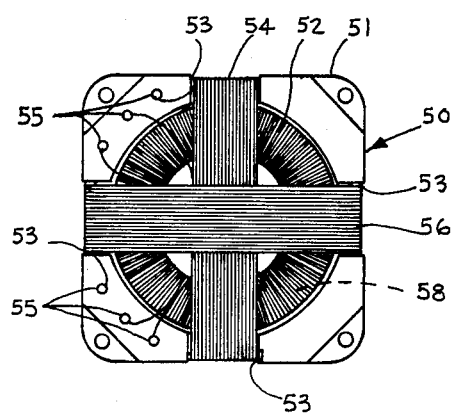
FIG. 4 is a plan view of the flux-gate sensor shown schematically in FIG. 2.

The compass system includes a flux-gate sensor 50, shown schematically in FIG. 2 and shown in FIG. 4. Sensor 50 is preferably mounted to the circuit board 43 (shown schematically in FIG. 2) which also contains the remaining circuit elements, shown in FIG. 2. The circuit board preferably is mounted near the sheet metal roof of the vehicle to position the flux-gate sensor near the roof. The metal roof is believed to provide a flux-steering effect to the earth's magnetic field which results in improved performance of flux-gate sensors over possible other locations in a vehicle.

Sensor 50 includes an annular core 58 around which there is wound the helical primary winding 52, as shown in FIG. 4. The annular core 58 and winding 52 are mounted to a plastic support 51 which centers and holds the core in position with respect thereto and around which the east/west secondary winding 54 and the north/south secondary winding 56 are wound. Each of the windings 52, 54 and 56 are of No. 36 gauge magnet wire suitably insulated. The primary winding 52 comprises approximately 250 equally spaced turns of such wire while the secondary windings 54 and 56 each comprise approximately 400 turns of such wire. Support 51 includes notches 53 for holding the secondary windings in position with respect to the primary winding. Each of the windings is terminated at suitable terminal posts 55 embedded in support 51 for subsequent connection to the electrical circuit components, as shown in FIG. 2. The annular core is a tape wound core commercially available from The Magnetics Division of Spang Ind., Butler, PA, Part No. 80653-1D042-02. The outer and inner diameters of the core are 15/16 inch and $\frac{3}{4}$ inch, respectively, and the secondary windings 54 and 56 have outer diameters wound around support 51 of approximately $1\frac{1}{8}$ and $1\frac{1}{4}$ inches, respectively.

The electrical drive circuit 60 for supplying drive signals to the primary 52 of sensor 50 includes a pair of solid state switches 62 and 64 coupled in a push/pull configuration. Switches 62 and 64, in the preferred embodiment of the invention, comprise transistors with transistor 62 being an NPN and transistor 64 being a PNP type. Transistor 62 is a 2N4401 while transistor 64 is a 2N4403, both of which are commercially available. The emitter of transistor 64 is coupled to the +V supply, which, in the preferred embodiment of the invention, was 5 volt regulated DC while the collector is coupled to a 160 ohm current limiting resistor 66 which, in turn, is coupled to an input terminal 57 of the flux-gate primary winding 52. The base of transistor 64 is coupled to the output of a driver amplifier 70 by means of a 10 k-ohm resistor 68. Similarly, NPN transistor 62 has its emitter coupled to system ground (0V) while its collector is coupled to terminal 57 through a 160 ohm current limiting resistor 63. The base terminal of transistor 62 is coupled to the output of amplifier 70 by means of a 10 k-ohm resistor 65. The remaining terminal 59 of primary winding 52 of sensor 50 is coupled to a floating ground 61 which is $\frac{1}{2}$ of the power supply +V or +2.5 volts DC. Coupled in parallel with primary winding 52 and in the emitter-to-collector current paths of transistors 62 and 64 is a current controlling resistor 69, the value of which is selected to provide the desired midpoint saturation of the core 58. In the preferred embodiment shown, the value of resistor 69 is 68 ohms. The selected value may vary depending on circuit parameters of other embodiments to provide current flow through the primary winding 52, as described in greater detail below in connection with FIG. 3, to provide saturation of the core at a predetermined time, and in the preferred embodiment, at approximately the midpoint of the drive signal waveform for each half cycle.

The signal applied to circuit 60 is shown by waveform A and is a squarewave signal supplied through a buffer 70 of conventional design which, in turn, is driven by a 1500 Hz squarewave signal output from terminal 17 of a microprocessor 100. Microprocessor 100 is a Motorola 6805 microprocessor which is programmed to supply a 1500 Hz output signal at its pin 17 which is applied to the input of amplifier 70. It is noted here that for purposes of simplifying the electrical schematic of FIG. 2, the conventional buffer amplifiers coupling output terminals of the microprocessor to the various interface circuits are not shown, it being understood that amplifiers, such as a CD4050, will be used to interconnect each of the outputs of the microprocessor to associated circuits. Similarly, in most cases, the conventional connection of the +V and $+V/2$ source 67 to the integrated circuits of FIG. 2 is not shown. The microprocessor 100 also is programmed to supply a 3 kHz output signal at pins 18 and 19 which, as will be explained hereinafter, are related in phase to the drive signal at output terminal 17 to assure that the synchronous phase detector 80 processes the signals from the flux-gate sensor 50 as required.

The secondary windings 54 and 56 of the flux-gate sensor 50 are commonly coupled at terminal 71 which is coupled to the system floating ground 61, as shown. Coupled across each of the secondary windings 54 and 56 is a one k-ohm damping resistor 72 and 73 to prevent oscillation of the output signals. The windings 54 and 56 corresponding to the east/west and north/south windings, respectively, are capacitively coupled to amplifiers 74 and 76, respectively, by means of coupling capacitors 75 and 77. Capacitors 75 and 77 are 0.1 μF 50 volt capacitors while amplifiers 74 and 76 include an LM2902 integrated circuit chip coupled in a conventional amplifier circuit configuration.

The output terminals of amplifiers 74 and 76 are coupled through resistors 78 and 79 to the inputs of an integrated circuit synchronous phase detector 80 comprising a National Semiconductor CD4016 integrated circuit chip. Circuit 80 comprises four bilateral switches, two of which are associated with each of the secondary coils 54 and 56 of the flux-gate sensor to supply signal information at inputs 8, 11 and 1, 4 to output terminals 9, 10 and 2, 3, respectively. The output terminals of circuit 80 are coupled to integrator circuits 82 and 84 through suitable integrating capacitors 81 and 83 associated with integrator 82, 85 and 86 associated with integrator 84, respectively. Integrators 82 and 84 thus receive alternate half cycle sinusoidal signals from the synchronous phase detector 80 to provide a time varying DC output signal at their output terminals representative of the direction sensed by coils 54 and 56 mounted to the vehicle, as described in greater detail in the above identified U.S. Pat. No. 4,546,551, the disclosure of which is incorporated herein by reference. These signals are fed back to the output terminals of secondary windings 54 and 56 through feedback resistors 87 and 88, respectively. Compass compensation correction information similarly is supplied to the output terminals of secondary windings 54 and 56 through resistors 94 and 96 and D-to-A converters 90 and 92 having their input terminals coupled to output terminals 24 and 23, respectively, of microprocessor 100. The compensation correction system as well as the internally programmed compass variation correction technique is described in greater detail in the above identified application.

The output signals of integrator 82 and 84 are coupled to signal input terminals 21 and 20 of microprocessor 100 through A-to-D converters 91 and 93 for converting the time varying DC input information into suitable digital signals compatible with the microprocessor 100. The signal conversion, shown by the A-to-D converter blocks 91 and 93 can be microprocessor controlled, as described in the above identified patent application if desired. The microprocessor 100 is coupled to a non-volatile memory 110 for, in part, retaining compensation and variation correction information. Memory 110 can be a National Semiconductor NMC9306 integrated circuit and is coupled to the microprocessor through the terminals as shown.

The microprocessor 100 also includes output terminals 8 and 9 coupled to a suitable display driver circuit 111 for providing signals to the digital display 35. The display driver 111 and display 35 can be any type of desired digital, alpha-numeric or graphic display. In the preferred embodiment, the display 35 was a vacuum-fluorescent alpha-type display, as shown in FIG. 1.

The microprocessor also receives temperature input information from a thermistor 120 coupled to the +V supply in a voltage dividing network including serially coupled resistor 122. The analog varying DC voltage from thermistor 120 is supplied to the microprocessor 100 in a digital format through an A-to-D converter 124. Similarly, compass and thermometer control and compensation and variation control signal information is supplied to the microprocessor 100 through switches 38, 39, 42 and 44 each having one terminal commonly coupled to system ground and a remaining terminal coupled to an input terminal of the microprocessor and to +V through a resistor network 130, as shown in FIG. 2. Thus, actuation of any of the switches 38-44 will cause one of the inputs of the microprocessor to go from a logic "1" state to a logic "0" providing control information thereto. The programming of the microprocessor to provide the desired compass operation is disclosed in greater detail in the above identified U.S. Pat. No. 4,546,551 and forms no part of the present invention other than to provide the output drive frequency signals supplied by the microprocessor as phase related clock pulses at output terminals 17, 18 and 19. These signals could also be independently generated by a separate oscillator and suitable counter circuits, as disclosed, for example, in U.S. Pat. No. 4,424,631, the disclosure of which is incorporated herein by reference.

The flux-gate drive circuit operation can best be understood with reference to the waveform diagrams of FIG. 3 in which the location of each of the waveforms A-F, inclusively, is shown on the schematic diagram of FIG. 2 by the corresponding identification letter.

The squarewave drive 1500 Hz drive signal A is applied to the base terminals of transistors 62 and 64 and during the time period $t_0$–$t_2$ the positive voltage applied to transistor 62 drives it into saturation whereupon current from the floating ground at +2.5 volts flows downwardly through the parallel current path of resistor 69 and winding 52 through collector resistor 63 and transistor 62 to ground. During this time period, transistor 64 is cutoff. During the time period $t_2$–$t_4$, however, transistor 62 is rendered nonconductive and transistor 64 conducts with current flow from +V through transistor 64, resistor 66 and the parallel current path of resistor 69 and winding 52 to the lower 2.5 volt floating ground. Thus, transistors 62 and 64 conduct alternatively to provide opposite direction current flow through primary winding 52. The voltage B is illustrated in FIG. 3B and is the voltage at terminal 57 of the primary winding. The waveform diagram of FIG. 3B shows a 1500 Hz signal which is a pulse having duration of ½ of each half cycle of the pulses A, shown in FIG. 3A. At times $t_1$ and $t_3$, the voltage pulse returns to the reference level of about 2.5 volts. The time and amplitude voltage signal of waveform B indicates the saturation of the flux-gate sensor core 68 at the mid-point between $t_0$ and $t_2$ and again between $t_2$ and $t_4$ in the opposite field direction. The saturation at a predetermined time which is the mid-point of each half of the driving cycle is important inasmuch as the resultant secondary waveform, shown in FIG. 3C, corresponding to the output signal of the north/south winding 56 results in sinusoidal half wave pulses which are of alternate polarity and which occur at $t_0$, $t_1$, $t_2$, $t_3$ and $t_4$ for each full cycle of drive waveform. The frequency of the sinusoidal 50 µs duration pulses resulting from the drive waveform is 3 kHz since a pair of alternate polarity pulses occurs at the output winding for each pulse supplied to the input.

The signals occuring at the output windings of the flux-gate sensors in the prior art system, for example that in the above identified patent application, Ser. No. 478,364, are relatively high frequency damped oscillating pulses occuring at times $t_0$, $t_2$ and $t_4$. These ringing signals could not be readily demodulated to provide the necessary signal information for processing and therefore digital filtration was required to obtain sinewave second harmonic frequency information.

FIG. 3D shows the amplified and inverted signal D from amplifier 76, which signal is applied to the synchronous phase detector. It will be understood by those skilled in the art that a similar shaped waveform will be applied to the synchronous phase detector 80 through amplifier 74. The amplitude and polarity of the pulses shown in waveform D and those corresponding pulses from amplifier 74 will be directly related to the direction of travel of the vehicle in which the flux-gate sensor is mounted. Thus, for example, with the vehicle heading directly north, the waveform D may be at a maximum amplitude and the polarity shown, while when the vehicle is heading directly south, the amplitude may be the same but the polarity reversed. Similarly, when the vehicle is moving in a directly east or west direction, the signal shown by waveform D may be at approximately 0 level, particularly when the system has been compensated for the local magnetic field disturbances caused by the vehicle. The east/west coil 50 similarly provides a varying signal relating to the direction of orientation of the flux-gate sensor with respect to the earth's magnetic field.

The synchronous phase detector 80 comprises pairs of bilateral switches with the signal of waveform D being applied through resistor 78 to inputs 1 and 4 corresponding to two separate switches. The associated signal from amplifier 74 is similarly applied to input terminals 8 and 11. The switches are driven by the 3 kHz pulses, shown as waveforms E and F, shown in FIGS. 3E and 3F. The centers of these 3 kHz pulses align with the times $t_0$, $t_1$, $t_2$, $t_3$ and $t_4$ for each cycle of operation. The pulses shown as waveforms E and F are applied to circuit 80 to alternately turn on the pair of switches contained in the synchronous phase detector such that the alternaate pulses, for example of waveform D, will be applied to the input terminals of integrator 82. Similarly, the other pair of switches contained in the synchronous phase detector will couple the similar waveform from amplifier 74 through resistor 79 and applied to input terminals 8 and 11 to integrator 84 through output terminals 9 and 10 such that the integrators 82 and 84 will see only the resultant signal waveform and provide a DC varying output signal which is directly representative of the orientation of the flux-gate sensor and therefore the vehicle in which it is mounted with respect to the earth's magnetic field.

By providing mid-point saturation, i.e., at times $t_1$ and $t_3$ of each cycle of applied drive signal, and by providing the clocking pulses E and F to the synchronous phase detector, which signals are phase shifted with respect to the drive signals A and B by 45 degrees, the information carrying signals D are applied to the integrator 82 (and the corresponding signal applied to integrator 84) only during the window defined by the clocking pulses E and F. Thus, by assuring the mid-point saturation of the flux-gate core, information contained in the pulses occuring at times $t_1$ and $t_3$ will not be lost or displaced from the remaining pulses at $t_0$, $t_2$ and $t_4$, and the resultant integrated information accurately represents the direction of travel of the vehicle without requiring sophisticated digital or analog filtering techniques as in the prior art.

Naturally, the selection of the value of resistor 69 to assure the mid-point saturation is essential. Decreasing of the resistor size shunting more current from winding 52 causes saturation to occur at a later point in time and widens pulses B. Similarly, by increasing the ohmic value of resistor 69, saturation will occur at an earlier point in time and shorten pulses B. It is noted that the waveform diagrams of FIGS. 3C and 3D are taken with the feedback loops including resistors 87, 88, 94 and 96 disconnected.

Various modifications to the preferred embodiment of the invention can be made without departing from the spirit or scope of the invention as defined by the appended claims.

The embodiments of the invention in which an exclusive property or privilege is claimed are defined as follows.

1. A drive circuit for providing signals to a primary winding of a flux-gate-type magnetic sensor used in a vehicle compass system comprising:
   a microprocessor for providing first and second frequency electrical drive signals having periodic waveforms wherein said second frequency signals are harmonically related to said first frequency signals;
   an electrical circuit coupled to said microprocessor for receiving said first frequency signals and including means for coupling an output of said electrical circuit to the primary winding of a flux-gate sensor, said electrical circuit providing an output signal which when applied to the primary winding of a flux-gate sensor causes saturation of the core of the flux-gate sensor at about midway of at least one half cycle of each period of said first frequency signals; and
   detector means coupled to said microprocessor and to said sensor and responsive to said second frequency signals applied thereto from said microprocessor for detecting second frequency components of signals from said sensor which represents direction heading information for the compass.

2. The circuit as defined in claim 1 wherein said electrical circuit includes current shunting means selected for controlling the time of saturation of the flux-gate sensor core.

3. The circuit as defined in claim 2 wherein said electrical circuit provides output signals in response to said drive signals for causing saturation of the core of a flux-gate sensor at about midway in the half cycles of each period of said drive signals.

4. The circuit as defined in claim 3 wherein said electrical circuit includes a pair of solid state switches coupled in push/pull relationship and having control input terminals coupled to said squarewave generator for receiving said drive signals therefrom.

5. The circuit as defined in claim 4 wherein said current shunting means includes a resistor having a first terminal coupled to said solid state switches, said resistor coupled in parallel relationship with a primary winding of a flux-gate sensor.

6. The circuit as defined in claim 5 wherein said electrical circuit includes a power source for providing a first DC output voltage, a second DC output voltage having a level equal to one half of said first voltage and a ground reference and wherein said push/pull switches are coupled to said power source to receive said first output voltage and said ground reference, and wherein said resistor has a second terminal coupled to said power source to receive said second DC output voltage therefrom.

7. The circuit as defined in claim 6 wherein said switches comprise a pair of transistors.

8. The circuit as defined in claim 7 wherein a first one of said transistors is a PNP type and has an emitter coupled to said power source to receive said first voltage therefrom and a collector coupled to said resistor and wherein the second transistor of said pair is an NPN type having an emitter coupled to ground and having a collector coupled to said resistor.

9. The circuit as defined in claim 8 wherein said first voltage is about +5 VDC.

10. The circuit as defined in claim 9 wherein said resistor has a value of about 68 ohms for use with a primary winding have 250 turns of 36 gauge magnet wire.

11. An electrical drive circuit for a flux-gate sensor used in a vehicle compass system comprising:
    a flux-gate sensor having a primary winding;
    a current shunting resistor coupled in parallel with said primary winding;
    a power supply having outputs providing a first output voltage, a second output voltage having a value less than said first voltage and a ground reference voltage, wherein one terminal of said primary winding is coupled to said voltage source to receive said second voltage therefrom;
    a source of periodic electrical drive signals; and
    controlled switch means having a control input terminal coupled to said source and three switch terminals, with a first terminal coupled to said ground reference, a second terminal coupled to said power supply to receive said first output voltage, and a third terminal coupled to a terminal of said primary winding opposite said one terminal thereof, said switch means responsive to said drive signals to provide current flow in alternate directions through said primary winding.

12. The circuit as defined in claim 11 wherein current flows through said primary winding and through said switch in a first direction from said second voltage output to ground and in a second direction from said first voltage output to said second voltage output.

13. The circuit as defined in claim 12 wherein said controlled switch means comprises a pair of solid state 14. The circuit as defined in claim 13 wherein said solid state switches are an NPN and a PNP transistor.

15. The circuit as defined in claim 14 wherein the value of said shunting resistor is selected to assure saturation of the flux-gate sensor core at about midway of each half cycle of operation.

16. An electrical compass system for a vehicle comprising:
a flux-gate sensor having a primary winding and a pair of orthogonally oriented secondary windings wound around a core;
a source of first and second frequency signals with said second frequency signals having a harmonic relationship to said first signals and phase shifted with respect thereto;
a drive circuit having an input coupled to said source and having an output coupled to said primary winding for providing periodic signals at said first frequency which saturate said core at about the mid-point of each half cycle of each period wherein said drive circuit comprises a current shunting resistor coupled in parallel with said primary winding, a power supply having outputs providing a first output voltage, a second output voltage having a value less than said first voltage and a ground reference voltage, wherein one terminal of said primary winding is coupled to said voltage source to receive said second voltage therefrom; and controlled switch means having a control input terminal coupled to said source and three switch terminals, with a first terminal coupled to said ground reference, a second terminal coupled to said power supply to receive said first output voltage, and a third terminal coupled to a terminal of said primary winding opposite said one terminal thereof, said switch means responsive to said drive signals to provide current flow in alternate directions through said winding; and
circuit means coupled to said secondary windings and said source for processing signals from said secondary windings in predetermined timed relationship thereto to provide output signals representative of the direction of orientation of the flux-gate sensor with respect to the earth's magnetic field; and
display means coupled to said circuit means for displaying the heading of the vehicle in response to signals from said circuit means.

17. The compass system as defined in claim 16 wherein current flows through said primary winding and through said switch in a first direction from said second voltage output to ground and in a second direction from said first voltage output to said second voltage output.

18. The compass system as defined in claim 17 wherein said controlled switch means comprises a pair of solid state switches.

19. The compass system as defined in claim 18 wherein said solid state switches are an NPN and a PNP transistor.

20. The compass system as defined in claim 19 wherein the value of said shunting resistor is selected to assure saturation of the flux-gate sensor core at about midway of each half cycle of operation.

21. The circuit as defined in claim 16 wherein said source of drive signals includes a microprocessor.

22. An electrical compass system for a vehicle comprising:
a flux-gate sensor having a primary winding and a pair of secondary windings;
a microprocessor for providing first and second frequency signals with said second frequency signals having a predetermined frequency relationship to said first signals;
a drive circuit having an input coupled to said microprocessor and having an output coupled to said primary winding for providing periodic drive signals to said primary winding at said first frequency;
detector means coupled to said secondary windings and to said microprocessor and responsive to second frequency signals from said microprocessor for processing signals from said secondary windings in predetermined timed relationship to said first frequency signals to provide signals to at least one input terminal of said microprocessor such that said microprocessor provides output signals representative of the direction of orientation of the flux-gate sensor with respect to the earth's magnetic field; and
display means coupled to said microprocessor for displaying the heading of the vehicle in response to signals from said microprocessor.

23. The system as defined in claim 22 wherein said detector means comprises controlled switch means coupled to said microprocessor to receive said second frequency signals therefrom for selectively applying signals from said secondary windings to said at least one input terminal of said microprocessor.

24. The system as defined in claim 23 wherein said second frequency signals are twice the frequency of said first frequency signals.

25. The system as defined in claim 24 wherein said drive circuit responds to said first frequency signals to saturate the core of said flux-gate sensor at about midway of at least one half-cycle of each cycle of said first frequency signals.

* * * * *

UNITED STATES PATENT AND TRADEMARK OFFICE
CERTIFICATE OF CORRECTION

PATENT NO. : 4,677,381

DATED : June 30, 1987

INVENTOR(S) : Steven L. Geerlings

It is certified that error appears in the above-identified patent and that said Letters Patent is hereby corrected as shown below:

Column 2, line 43:

"3" should be --33--

Column 3, line 31:

"1/8" should be --1-1/8--

Column 6, lines 25 and 26:

"Ser. No. 478,364" should be --U.S. Patent No. 4,546,551--

Column 6, line 66:

"alternaate" should be --alternate--

Column 9, claim 13, line 4:

after "state" insert --switches--

Signed and Sealed this

Fifteenth Day of March, 1988

*Attest:*

DONALD J. QUIGG

*Attesting Officer*  *Commissioner of Patents and Trademarks*